United States Patent
Kuznetsov et al.

(10) Patent No.: US 10,916,356 B2
(45) Date of Patent: Feb. 9, 2021

(54) REFLECTIVE OPTICAL ELEMENT

(71) Applicant: Carl Zeiss SMT GmbH, Oberkochen (DE)

(72) Inventors: Dmitry Kuznetsov, Enschede (NL); Andrey E. Yakshin, Niewegein (NL); Hartmut Enkisch, Aalen (DE); Viacheslav Medvedev, Moscow (RU); Frederik Bijkerk, Bosch en Duin (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/511,166

(22) Filed: Jul. 15, 2019

(65) Prior Publication Data

US 2020/0027623 A1    Jan. 23, 2020

(30) Foreign Application Priority Data

Jul. 18, 2018    (DE) .................. 10 2018 211 980

(51) Int. Cl.
*G21K 1/06* (2006.01)
*G03F 7/20* (2006.01)

(52) U.S. Cl.
CPC ........... *G21K 1/062* (2013.01); *G03F 7/7015* (2013.01); *G03F 7/70958* (2013.01)

(58) Field of Classification Search
CPC ........ G21K 1/06; G21K 1/062; G03F 7/7015; G03F 7/20; H05G 2/00; H05G 2/001; H05G 2/003; H05G 2/005; H05G 2/006; H05G 2/008
See application file for complete search history.

(56) References Cited

U.S. PATENT DOCUMENTS 9,996,005 B2 * 6/2018 Ehm .................. G02B 1/105
2003/0008180 A1 * 1/2003 Bajt .................. G02B 5/0891
428/698

(Continued)

FOREIGN PATENT DOCUMENTS

DE    10 2011 076 011 A1    11/2012
DE    10 2012 202 850 A1    8/2013

(Continued)

OTHER PUBLICATIONS

German Examination Report, with translation thereof, for corresponding Appl No. 10 2018 211 980.5, dated Feb. 18, 2019.

*Primary Examiner* — David E Smith

(74) *Attorney, Agent, or Firm* — Fish & Richardson P.C.

(57) ABSTRACT

For a working wavelength in the range from 1 nm to 12 nm, a reflective optical element has, on a substrate, a multilayer system that includes at least two alternating materials having a different real part of the refractive index at the working wavelength. The multilayer system includes a first alternating material from the group formed from thorium, uranium, barium, nitrides thereof, carbides thereof, borides thereof, lanthanum carbide, lanthanum nitride, lanthanum boride, and a second alternating material from the group formed from carbon, boron, boron carbide, or lanthanum as first alternating material and carbon or boron as second alternating material. It has, on the side of the multilayer system remote from the substrate, a protective layer system including a nitride, an oxide and/or a platinum metal.

15 Claims, 16 Drawing Sheets

(56) References Cited

U.S. PATENT DOCUMENTS

| | | | |
|---|---|---|---|
| 2003/0128810 A1* | 7/2003 | Verman | G21K 1/062 |
| | | | 378/84 |
| 2011/0194087 A1 | 8/2011 | Tsarfati et al. | |
| 2011/0194097 A1 | 8/2011 | Yamaguchi et al. | |
| 2014/0193591 A1* | 7/2014 | Kuznetzov | G21K 1/062 |
| | | | 427/527 |
| 2014/0199543 A1 | 7/2014 | Ehm et al. | |
| 2016/0187543 A1* | 6/2016 | Bekman | G03F 7/70958 |
| | | | 359/360 |
| 2016/0202396 A1* | 7/2016 | Goehnermeier | G03F 7/70316 |
| | | | 359/359 |
| 2019/0235141 A1* | 8/2019 | Naujok | G21K 1/062 |

FOREIGN PATENT DOCUMENTS

| | | | | |
|---|---|---|---|---|
| WO | WO 2013/124224 A1 | 8/2013 | | |
| WO | WO-2013124224 A1 * | 8/2013 | ......... | G03F 7/70958 |

\* cited by examiner

REFLECTIVE OPTICAL ELEMENT

CROSS-REFERENCE TO RELATED APPLICATIONS

The present application claims the priority of German Patent Application 10 2018 211 980.5 of Jul. 18, 2018, the disclosure of which is hereby incorporated into the present application by reference in its entirety.

FIELD

The present disclosure relates to a reflective optical element for a working wavelength in the range from 1 nm to 12 nm, having a multilayer system composed of at least two alternating materials having a different real part of the refractive index at the working wavelength. The disclosure further relates to an optical system and to an EUV lithography apparatus having such a reflective optical element.

BACKGROUND

Reflective optical elements for working wavelengths below 20 nm, especially in the range from 1 nm to 12 nm, generally have multilayer systems as reflective coating. This involves alternately applied layers of a material having a higher real part of the refractive index at the working wavelength (also called "spacer") and of a material having a lower real part of the refractive index at the working wavelength (also called "absorber"), wherein an absorber-spacer pair forms a stack or a period. To some degree, this simulates a crystal, the lattice planes of which correspond to the absorber layers where Bragg reflection takes place. Such reflective optical elements are known, for example, from US 2011/194087 A1.

Such reflective optical elements may find use, for example, in spectroscopes for x-ray fluorescence analysis or x-ray structure analysis, in astrophysical telescopes in space, in optics for free electron lasers (FEL), generally in spectroscopy, and in the lithographic production of semiconductor components and lithography masks, and the optical verification thereof.

In most applications, it is possible to use more than one such reflective optical element, such that reflectivity losses correspondingly increase exponentially and have adverse effects over the lifetime. A factor that can lead to losses of reflectivity is the contamination of the reflective coating. Even in the case of operation under reduced pressure, the residual gas atmosphere may still include hydrogen, oxygen, water and hydrocarbon compounds. The molecules present in the residual gas atmosphere are continuously ad- and desorbed at the surface of the reflective coating. They can be dissociated here by the radiation or else by photoelectrons formed by action of the radiation on the reflective coating, and in turn react with the surface of the reflective coating. Especially dissociated oxygen and dissociated water can lead to oxidation of the surface of the reflective coating, which in many cases can be irreversible and can therefore particularly lead to a shortened lifetime.

SUMMARY

The present disclosure seeks to improve reflective optical elements of the type specified at the outset such that they can have a longer lifetime.

The disclosure provides a reflective optical element for a working wavelength in the range from 1 nm to 12 nm, having, on a substrate, a multilayer system composed of at least two alternating materials having a different real part of the refractive index at the working wavelength, wherein the multilayer system includes a first alternating material from the group formed from thorium, uranium, barium, nitrides thereof, carbides thereof, borides thereof, lanthanum carbide, lanthanum nitride, lanthanum boride, and a second alternating material from the group formed from carbon, boron, boron carbide, or lanthanum as first alternating material and carbon or boron as second alternating material, and it has, on the side of the multilayer system remote from the substrate, a protective layer system including a nitride, an oxide and/or a platinum metal.

It has been found that such a reflective optical element can not only have a particularly high reflectivity at working wavelengths in the range from 1 nm 12 nm—especially at working wavelengths in the range between 5 nm and 8 nm—but is also relatively inert to oxidation by dissociated molecules from the residual gas atmosphere within this wavelength range from 1 nm 12 nm, i.e. at comparatively high photon energies, and at the same time has comparatively low absorption within this wavelength range, such that the reflectivity of the multilayer system is not too greatly impaired by the protective layer system. Moreover, such a reflective optical element has good thermal stability, which is advantageous especially in the case of use with radiation sources of high intensity and correspondingly high load, as for instance in the case of an FEL or in lithography.

Advantageously, the protective layer system includes a material that differs from the at least two alternating materials of the multilayer system. By comparison with protective layer systems that differ from the multilayer system that they protect merely by geometric design variations, for example different layer thicknesses, different layer thickness ratios or different material sequences, the use of the at least one material in the protective layer system which is not provided in the multilayer system can achieve a better protection function against outside influences.

In a first preferred embodiment, the protective layer system is in monolayer form. Such a protective layer system is particularly easy to produce. The single layer of the protective layer system preferably consists of a nitride, an oxide and/or a platinum metal. More preferably, the single layer consists of zirconium dioxide, boron oxide, lanthanum oxide, titanium dioxide, zirconium nitride, silicon-doped zirconium nitride, titanium nitride, silicon-doped titanium nitride, chromium nitride, silicon-doped chromium nitride, ruthenium or palladium.

Advantageously, the protective layer system has at least two layers and it includes one of the at least two alternating materials of the multilayer system. This can simplify the production process. It is particularly advantageous when at least one further material not provided in the multilayer system is also used in the protective layer system.

In further preferred embodiments, the protective layer system is in bilayer form. This has the advantage that, through choice of the layer materials and/or the layer thicknesses, it is possible to achieve both good protection against oxidative contamination and good reflectivity at the working wavelength.

Advantageously, the layer closer to the multilayer system is of carbon, boron or boron carbide. Particularly at wavelengths between 1 nm and 12 nm, carbon, boron and boron carbide have comparatively low absorption and a relatively high real part of the refractive index, such that they are of good suitability for influencing the reflectivity of the reflective optical element. Particular preference is given here to carbon since, when it has no interface to the vacuum, it can act as a diffusion barrier against oxygen, as has been found.

It can likewise be advantageous in the case of bilayer protective layer systems, if the layer closer to the multilayer system is of one of the two alternating materials. Taking account of the material and the thickness of the layer further removed from the multilayer system, the thickness of the layer closer to the multilayer system can be adjusted so as to maximize the reflectivity of the reflective optical element with a bilayer protective layer system. It is particularly advantageous here, if the layer closer to the multilayer system is of material having the higher real part of the refractive index when the layer of the multilayer system closest to the protective layer system is of material having the lower real part of the refractive index, and vice versa.

In a further preferred embodiment of the reflective optical element, the protective layer system is in trilayer form in order to be able to obtain very good reflectivity of the reflective optical element in spite of protection from oxidative contamination with not too complicated a construction of the protective layer system.

More preferably, the middle layer here is of carbon, boron or boron carbide and the layer closer to the multilayer system is of one of the two alternating materials, in order to be able to achieve maximum reflectivity in spite of the protective layer system.

In a further preferred embodiment, the protective layer system is formed from two or more bilayers. The provision of a protective layer system having two, three, four, five, six, seven, eight, nine or more bilayers firstly enables very good protection from oxidative contamination since every bilayer includes an oxide, a nitride or a platinum metal and can protect the layers beneath. On the other hand, a protective layer system effectively in the form of a multilayer system permits effective optimization of the reflectivity of the reflective optical element.

More preferably, the layer of a bilayer closer to the multilayer system in each case is of carbon, boron or boron carbide. Owing to their complex refractive index in the wavelength range between 1 nm and 12 nm, these materials are particularly suitable for assuming the function of a kind of spacer layer and hence permitting optimization of the reflectivity. Particular preference is given here to carbon owing to its additional function as diffusion barrier against oxygen.

In a further preferred embodiment, the protective layer system is formed from two or more trilayers in order to be able to achieve both good protection against oxidative contamination and maximum reflectivity.

More preferably, in this case, the middle layer in each case is of carbon and the layer closer to the multilayer system in each case is of boron, or the middle layer in each case is of boron and the layer closer to the multilayer system in each case is of carbon. In this way, it is possible to maximize reflectivity particularly efficiently specifically for working wavelengths between 1 nm and 12 nm.

In the case of multilayer systems constructed from layers of the at least two alternating materials of constant thickness, where a repeating sequence of the alternating materials forms a stack, the thickness of the bilayers or trilayers may substantially correspond to the thickness or half the thickness of the stack of the multilayer system. This can achieve higher reflectivities. In further variants, it may also be advantageous when the bi- or trilayers have a different thickness from the thickness or half the thickness of the stack of the multilayer system.

In the case of multilayer systems in which a repeating sequence of the alternating materials forms a stack and the ratio G' of the thickness of the alternating material of a stack with the smallest real part of the refractive index to the total thickness of the stack is constant, it is preferable that the ratio G of the thickness of the layer of the bi- or trilayer with the smallest real part of the refractive index at the working wavelength to the total thickness of the bi- or trilayer does not equal the ratio G'. Via the varying of the ratio G, it is possible to significantly influence and hence efficiently optimize the reflectivity. "Constant" should be considered here within the scope of manufacturing tolerances.

The protective layer system more preferably has two subsystems that differ in at least one material. In this way, it is possible in a particularly flexible manner to optimize both the protection function and the reflectivity of the resulting reflective optical element.

More preferably, the protective layer system includes a material from the group formed from zirconium dioxide, boron oxide, lanthanum oxide, titanium dioxide, zirconium nitride, silicon-doped zirconium nitride, titanium nitride, silicon-doped titanium nitride, chromium nitride, silicon-doped chromium nitride, ruthenium and palladium. In the case of these materials, the abovementioned properties are particularly pronounced within the wavelength range from 1 nm to 12 nm.

Moreover, the problem is solved by an optical system having a reflective optical element as described above, and by an EUV lithography apparatus having such an optical system or having a reflective optical element as described above. The optical system mentioned can also be employed in terrestrial or extraterrestrial spectroscopy and used, for example, in the inspection of wafers or masks.

BRIEF DESCRIPTION OF THE DRAWINGS

The present disclosure is to be elucidated in detail with reference to preferred working examples. The figures show.

DETAILED DESCRIPTION

Figure 1:
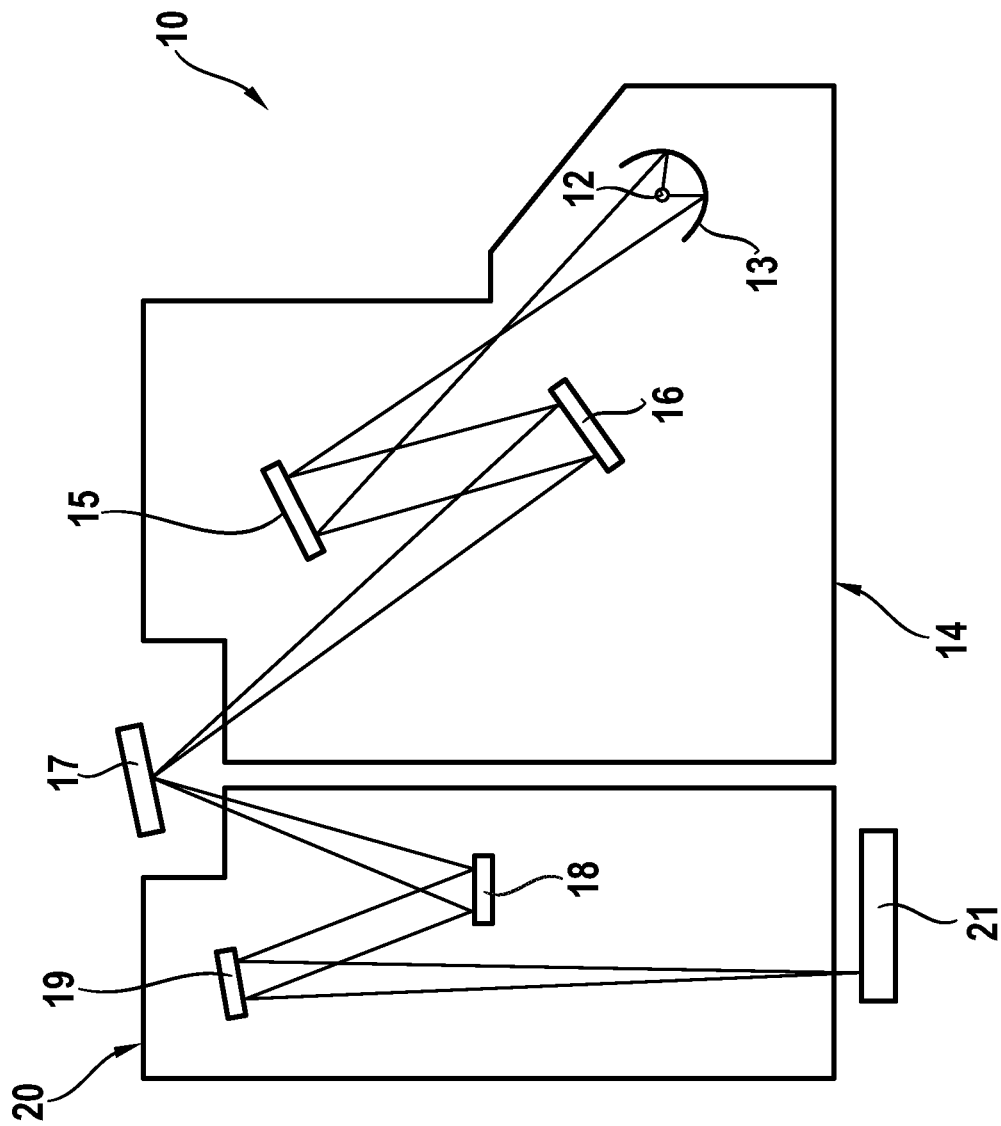
FIG. 1 a schematic of an embodiment of an EUV lithography apparatus having optical systems.

FIG. 1 schematically shows a lithography apparatus 10. Components include the illumination system 14, the photomask 17 and the projection system 20. The EUV lithography apparatus 10 is operated under vacuum conditions in order that the radiation is absorbed to a minimum degree in the interior thereof within a wavelength range between 1 nm and 12 nm and the proportion of residual gas in the atmosphere is at a minimum.

A preferred narrowband radiation source 12 that may be used is, for example, a laser-induced plasma source based on tin, xenon, krypton, lithium, silicon, terbium, gadolinium, aluminium or magnesium or else a free electron laser or a synchrotron. In the example illustrated here, a laser-induced plasma source is used. The emitted radiation in the wavelength range of approximately 1 nm to 12 nm is firstly focused by the collector mirror 13. In the example shown here, the radiation source 12 and the collector mirror 13 are integrated into the illumination system 14. In variants, it is also possible for just the collector mirror 13 or for neither the collector mirror 13 nor the radiation source 12 to be integrated into the illumination system 14. In the example shown in FIG. 1, the illumination system 14 has two mirrors 15, 16 in the beam path beyond the collector mirror 13, onto which the beam is directed from the collector mirror 13. The mirrors 15, 16 in turn guide the beam onto the photomask 17 having the structure which is to be imaged onto the wafer 21. The photomask 17 is likewise a reflective optical element for the EUV wavelength range between 1 nm and 12 nm, which is exchanged depending on the production process. With the aid of the projection system 20, the beam reflected from the photomask 17 is projected onto the wafer 21 and hence the structure of the photomask 17 is imaged onto the wafer. In the example illustrated, the projection system 20 has two mirrors 18, 19. It should be pointed out that both the projection system 20 and the illumination system 14 can each have just one or else three, four, five or more mirrors.

Both the collector mirror 13 and the mirrors 15, 16, 18, 19 and the photomask 17 may take the form of a reflective optical element for a working wavelength in the range from 1 nm to 12 nm, having a multilayer system composed of at least two alternating materials having a different real part of the refractive index at the working wavelength, and a protective layer system including a nitride, an oxide and/or a platinum metal. In particular, the multilayer system may include a first alternating material from the group formed from thorium, uranium, barium, nitrides thereof, carbides thereof, borides thereof, lanthanum carbide, lanthanum nitride, lanthanum boride, and a second alternating material from the group formed from carbon, boron, boron carbide, or lanthanum as first alternating and carbon or boron as second alternating material. At least one, preferably more than one, more preferably all, reflective optical elements 13, 15 to 19 are of such a design.

Analogously, what has been elucidated in conjunction with FIG. 1 is also applicable to applications other than EUV lithography, for example the inspection of masks or wafers or for terrestrial or extraterrestrial spectroscopy.

A reflective optical element as proposed is to be elucidated schematically and by way of example with reference to FIGS. 2 to 10 that follow. The reflective optical element 50 comprises a multilayer system 54 on a substrate 51. Typical substrate materials are, for example, silicon, silicon carbide, silicon-infiltrated silicon carbide, quartz glass, titanium-doped quartz glass and glass ceramic. Furthermore, the substrate can also be composed of metal, for instance of copper, aluminium, a copper alloy, an aluminium alloy or a copper-aluminium alloy.

The multilayer system 54 comprises alternately applied layers of a material having a higher real part of the refractive index at the working wavelength at which for example the lithographic exposure is carried out (also called spacer 57) and of a material having a lower real part of the refractive index at the working wavelength (also called absorber 56), wherein an absorber-spacer pair forms a stack 55. To some degree, this simulates a crystal, the lattice planes of which correspond to the absorber layers where Bragg reflection takes place.

The thicknesses of the individual layers 56, 57 and also of the repeating stacks 55 that are formed from the smallest possible repeating sequence of the adjoining layers of the multilayer system, here the layers 56, 57, may be constant over the entire multilayer system 54 or else vary over the area or the total thickness of the multilayer system 54 depending on what spectral or angle-dependent reflection profile or what maximum reflectivity at the working wavelength is to be achieved. When the stacks have a constant thickness over the total thickness of the multilayer system 54, they may also be called periods. The reflection profile can also be influenced in a controlled manner in that the basic structure composed of absorber 56 and spacer 57 is supplemented by further more and less absorbent materials in order to increase the possible maximum reflectivity at the respective working wavelength. To that end, in some stacks absorber and/or spacer materials can be mutually interchanged or the stacks can be constructed from more than one absorber and/or spacer material. Furthermore, it is also possible, in one or more or all stacks 55, to provide additional layers as diffusion barriers at the transition from spacer to absorber layers 57, 56 and/or at the transition from absorber to spacer layer 56, 57. With the aid of diffusion barriers, it is possible to increase the reflectivity of real multilayer systems, even over longer periods of time or under heating. It should be pointed out that, in the examples shown here, the first layer of the multilayer system 54 that follows the substrate 51 is an absorber layer 56. In variants that are not shown, this may also be a spacer layer 57. It is likewise possible for the layer of the multilayer system 54 furthest removed from the substrate 51, rather than a spacer layer 57 as in the examples shown here, to be an absorber layer 56. Especially for working wavelengths in the range between 1 nm and 12 nm, for example, materials from the group formed from thorium, uranium, barium, nitrides thereof, carbides thereof, borides thereof, lanthanum carbide, lanthanum nitride, lanthanum boride are suitable as absorber materials, and, for example, materials from the group formed from carbon, boron, boron carbide as spacer materials. Likewise suitable are the material combinations of lanthanum as absorber material in conjunction with carbon or boron as spacer material.

According to the disclosure, a protective layer system 52 is provided on the multilayer system 54. As set out hereinafter, the protective layer system 52 may be executed in monolayer or multilayer form and includes a nitride, an oxide and/or a platinum metal in order to increase resistance to oxidative contamination and lifetime with minimum losses of reflectivity. In the multilayer embodiment, a protective layer system may also include different subsystems. Particularly suitable protective layer systems 52 have been found to be especially those that include zirconium dioxide, boron oxide, lanthanum oxide, titanium dioxide, zirconium nitride, silicon-doped zirconium nitride, titanium nitride, silicon-doped titanium nitride, chromium nitride, silicon-doped chromium nitride, ruthenium and/or palladium. In variants, the layer materials of the protective layer system may correspond to the layer materials of the multilayer system and achieve a protection function primarily, for example, via differences in the stack thicknesses and/or ratios of layer thickness of the material with the lowest real part of the refractive index at the working wavelength in the protective layer system on the one hand and the multilayer system on the other hand. In the examples which follow, however, the emphasis is on embodiments in which the protective layer system includes a material that differs from the at least two alternating materials of the multilayer system since a particularly good protection function can be achieved thereby.

Figure 2:
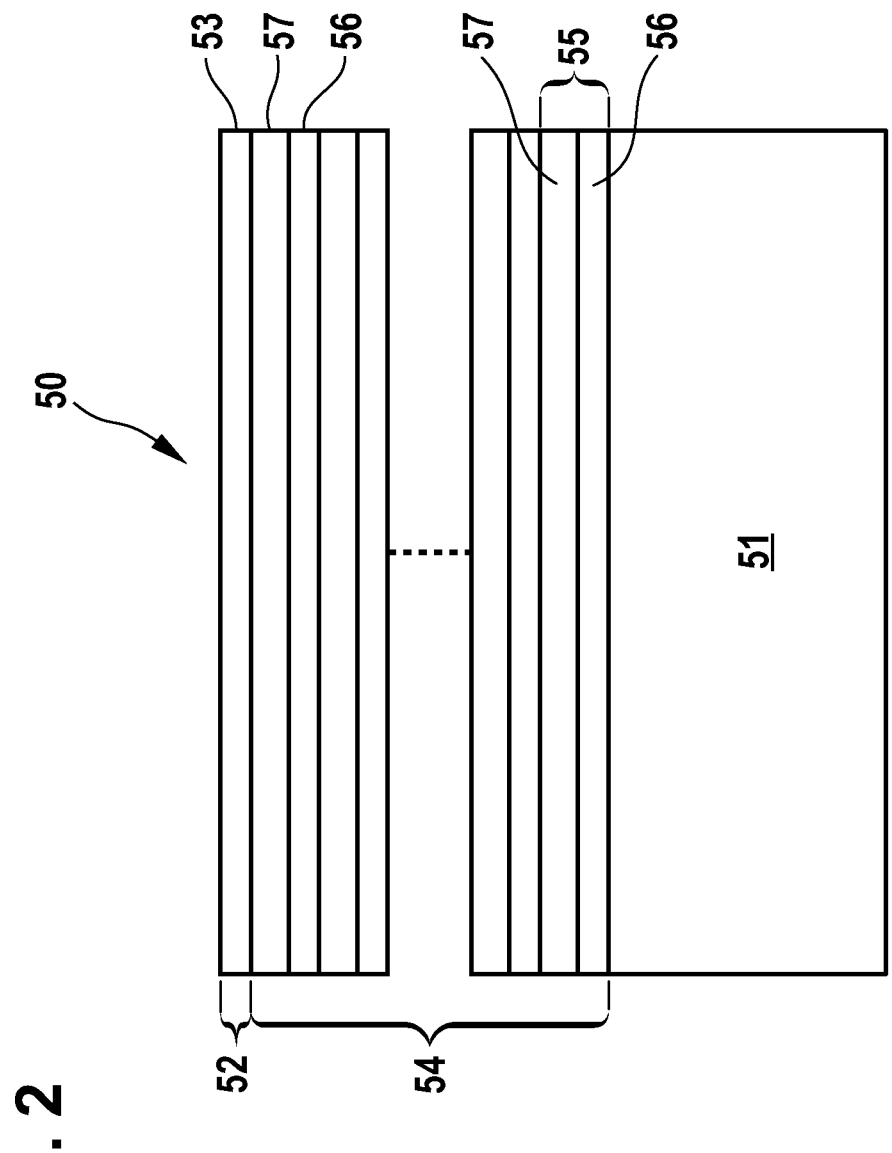
FIG. 2 a schematic of a first embodiment of a reflective optical element having a multilayer system.

In the example shown in FIG. 2, the protective layer system 52 is in monolayer form. More preferably, the single layer 53 of the protective layer system in the example shown here consists of zirconium dioxide, boron oxide, lanthanum oxide, titanium dioxide, zirconium nitride, silicon-doped zirconium nitride, titanium nitride, silicon-doped titanium nitride, chromium nitride, silicon-doped chromium nitride, ruthenium or palladium. It should be pointed out that, especially for layers 53 that include an oxide or consist of an oxide, there is advantageously no reliance on the formation of the oxide at the surface of the reflective optical element 50 during its operation, but instead controlled application of the layer 53 in an oxygen atmosphere in the course of production of the reflective optical element, since a layer 53 with lower roughness and hence lower loss of reflectivity by scattered radiation can be achieved in this way. Nitride layers or nitride-containing layers are analogously preferably deposited on the multilayer system 54 in a nitrogen atmosphere. It has also been observed that the surfaces of oxide or nitride layers applied in a controlled manner, even during the operation of the respective reflective optical element 50, become roughened or can be destroyed to a lesser degree than, for example, oxide layers that have only formed during operation at the surface of the reflective optical element.

Figure 3:
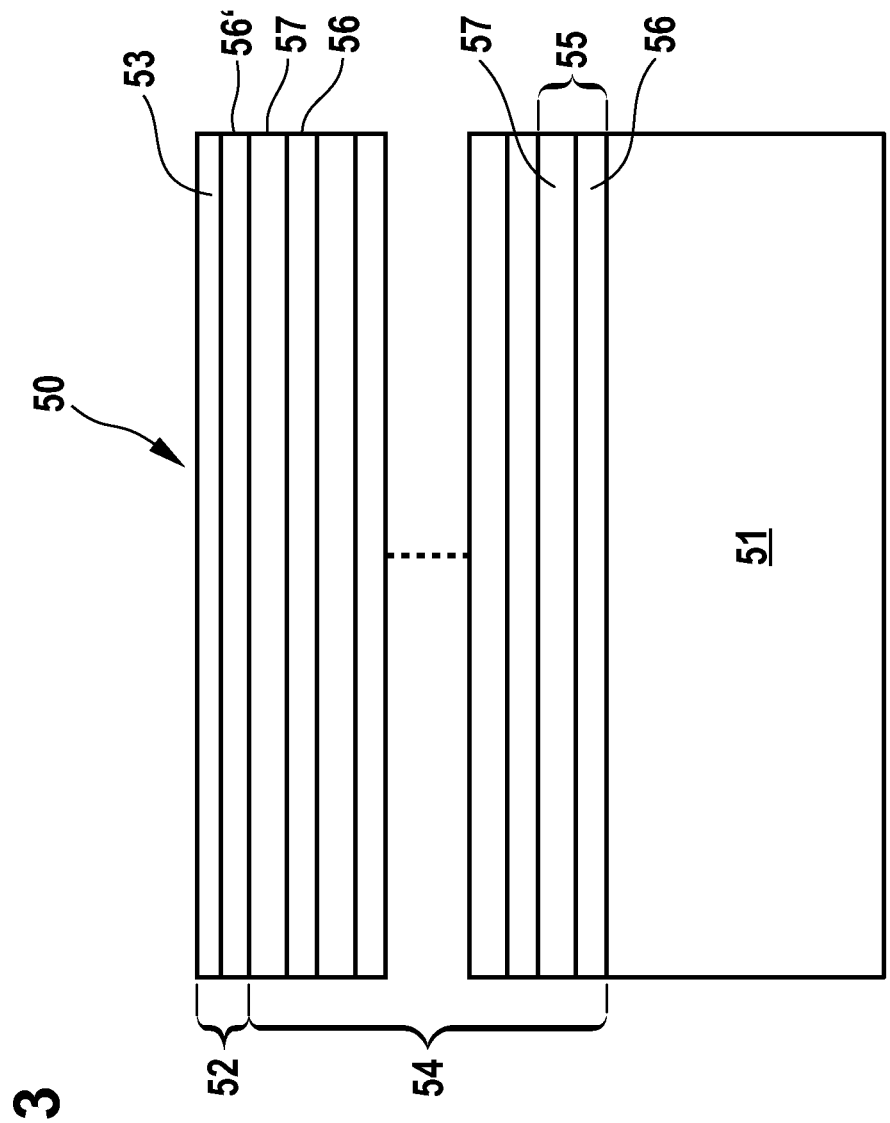
FIG. 3 a schematic of a second embodiment of a reflective optical element having a multilayer system.
Figure 4:
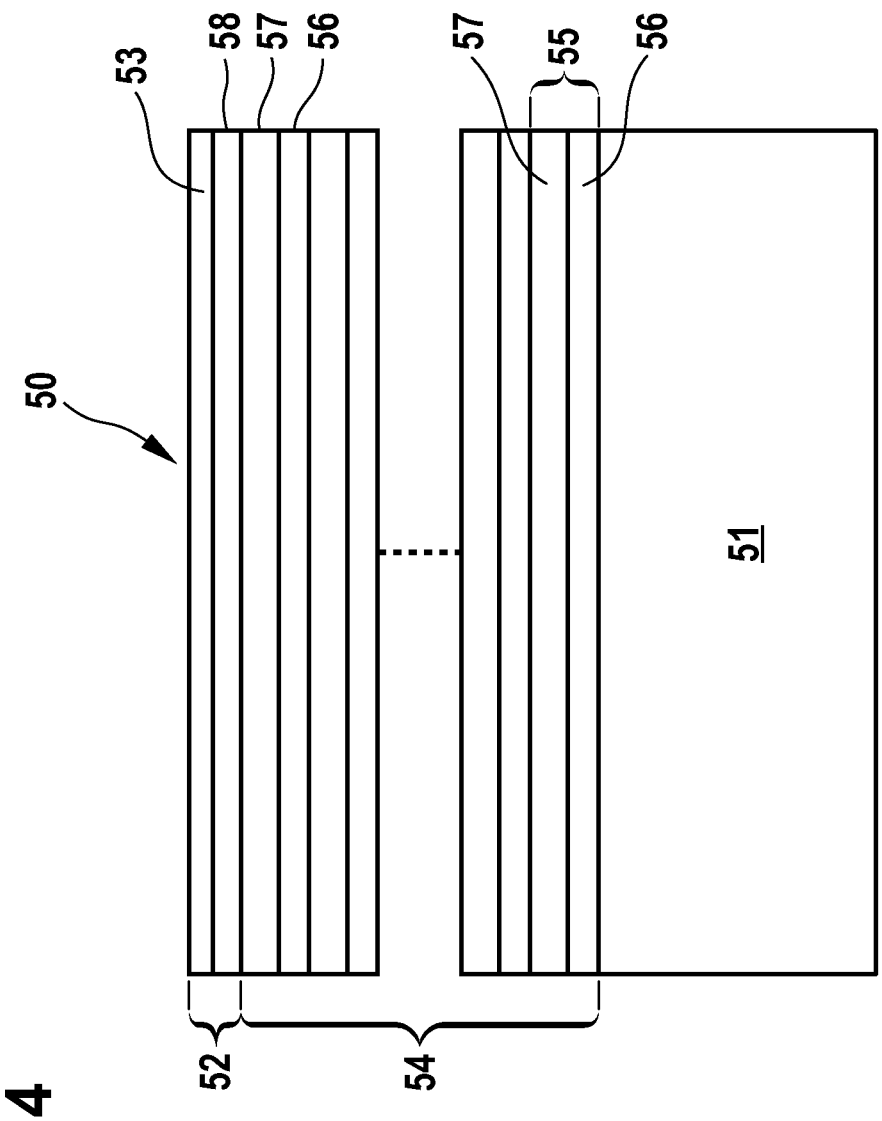
FIG. 4 a schematic of a third embodiment of a reflective optical element having a multilayer system.

In the examples shown in FIGS. 3 and 4, the protective layer system 52 is in bilayer form. In the example shown in FIG. 3, the layer 56' closer to the multilayer system 54 is of one of the two alternating materials 56, 57 with different refractive index at the working wavelength between 1 nm and 12 nm. The variant shown here is a layer 56' of absorber material. In further variants that are not shown, this may likewise be a layer of spacer material. In the example shown in FIG. 4, the layer 58 of the protective layer system 52 closer to the multilayer system 54 may be a carbon layer. In further variants that are not shown, this may also be a boron or boron carbide layer. More preferably, the layer 53 further removed from the multilayer system 54 consists of zirconium dioxide, boron oxide, lanthanum oxide, titanium dioxide, zirconium nitride, silicon-doped zirconium nitride, titanium nitride, silicon-doped titanium nitride, chromium nitride, silicon-doped chromium nitride, ruthenium or palladium.

Figure 5:
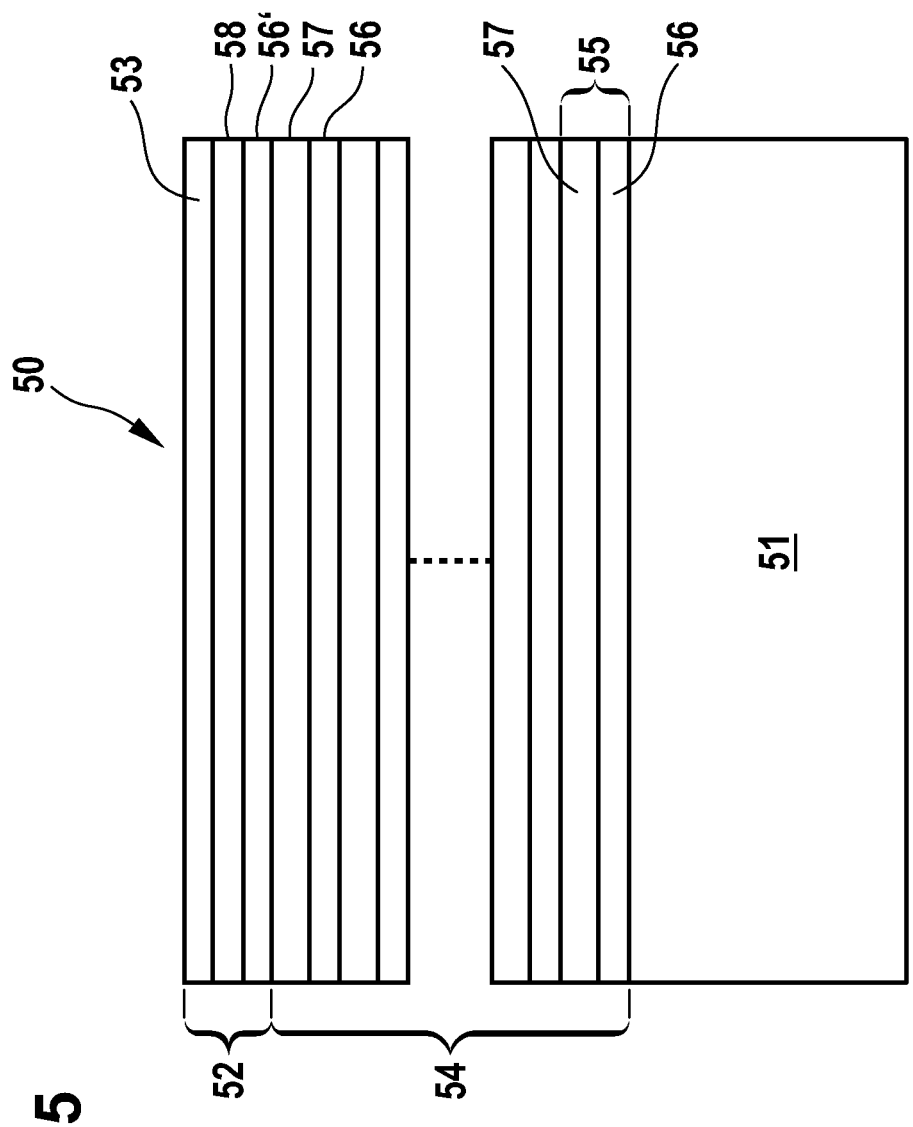
FIG. 5 a schematic of a fourth embodiment of a reflective optical element having a multilayer system.

In the example shown in FIG. 5, the protective layer system 52 is in trilayer form, wherein, in the example shown here, the middle layer 58 is of carbon and the layer 56' closer to the multilayer system is of one of the two alternating materials, in the example shown here of the absorber material. In further variants that are not shown here, the middle layer may also be a boron or boron carbide layer, or the layer closer to the multilayer system may be spacer material. More preferably, the layer 53 further removed from the multilayer system 54 consists of zirconium dioxide, boron oxide, lanthanum oxide, titanium dioxide, zirconium nitride, silicon-doped zirconium nitride, titanium nitride, silicon-doped titanium nitride, chromium nitride, silicon-doped chromium nitride, ruthenium or palladium.

Both in the bilayer and in the trilayer embodiments of the protective layer system 52, which may also be referred to as embodiments with a protective layer system 52 having exactly one bilayer or trilayer, the thickness of the protective layer system 52 or of the bilayer or trilayer may correspond substantially to the whole of or half the stack thickness of the multilayer system, especially in the case of a constant stack thickness throughout, or else may differ therefrom. In the examples shown here, the thicknesses of absorber layers, spacer layers or any other layers are substantially constant in each case from bilayer to bilayer or trilayer to trilayer. The ratio G of the thickness of the layer of the bi- or trilayer having the smallest real part of the refractive index at the working wavelengths to the total thickness of the bi- or trilayer may be equal or preferably not equal to the corresponding ratio G' of the thickness of the alternating material of a stack having the smallest real part of the refractive index to the total thickness of the stack of the multilayer system. In order to simplify the production process, one of the materials of the bi- or trilayer may correspond to one of the at least two alternating materials from the multilayer system stacks.

Figure 6:
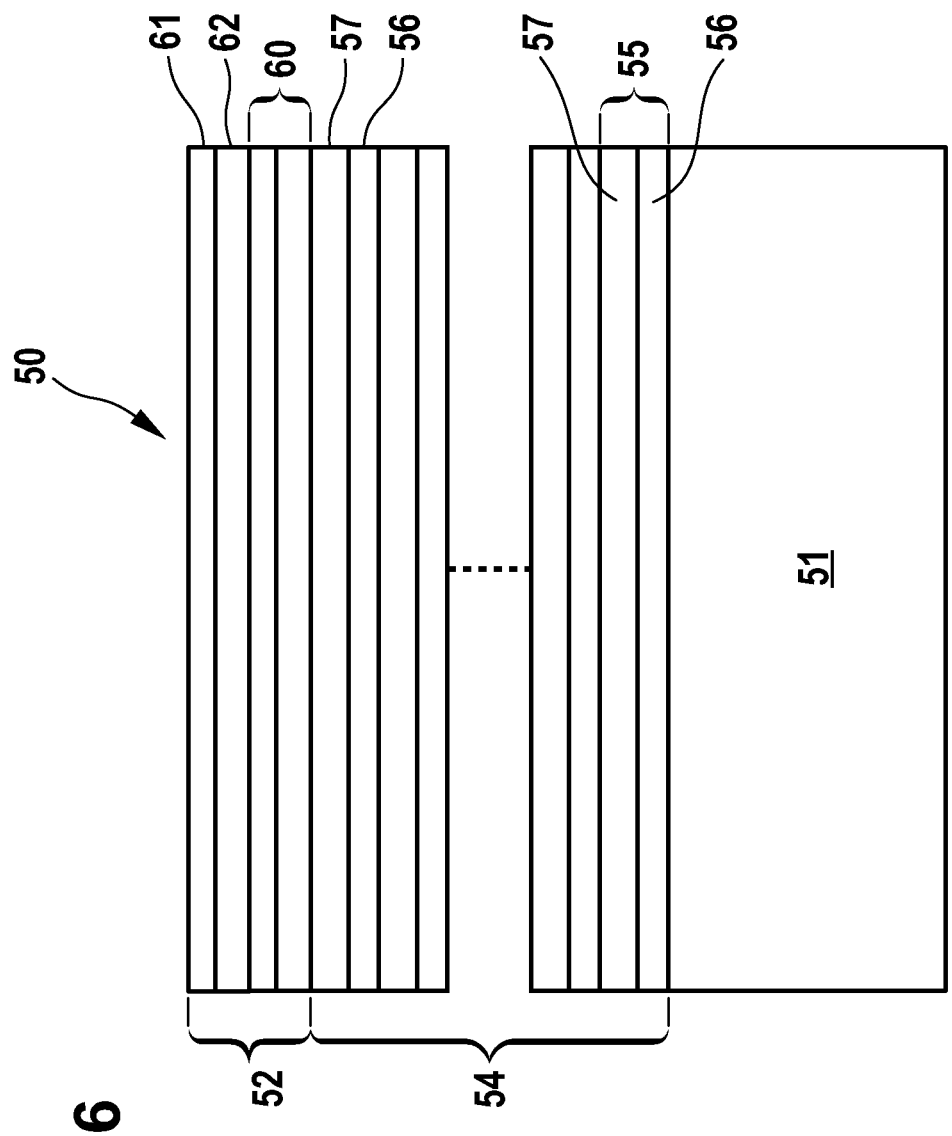
FIG. 6 a schematic of a fifth embodiment of a reflective optical element having a multilayer system.

In the example shown in FIG. 6, the protective layer system 52 is formed from two bilayers 60. In further variants that are not shown, the protective layer system 52 may also have been constructed from three, four, five, six, seven, eight, nine or more bilayers 60. In the example shown here, the layer 62 of a bilayer 60 which is closer to the multilayer system 54 in each case is a carbon layer. In further variants that are not shown, this may also be a boron or boron carbide layer. More preferably, the layer 53 further removed from the multilayer system 54 consists of zirconium dioxide, boron oxide, lanthanum oxide, titanium dioxide, zirconium nitride, silicon-doped zirconium nitride, titanium nitride, silicon-doped titanium nitride, chromium nitride, silicon-doped chromium nitride, ruthenium or palladium.

Figure 7:
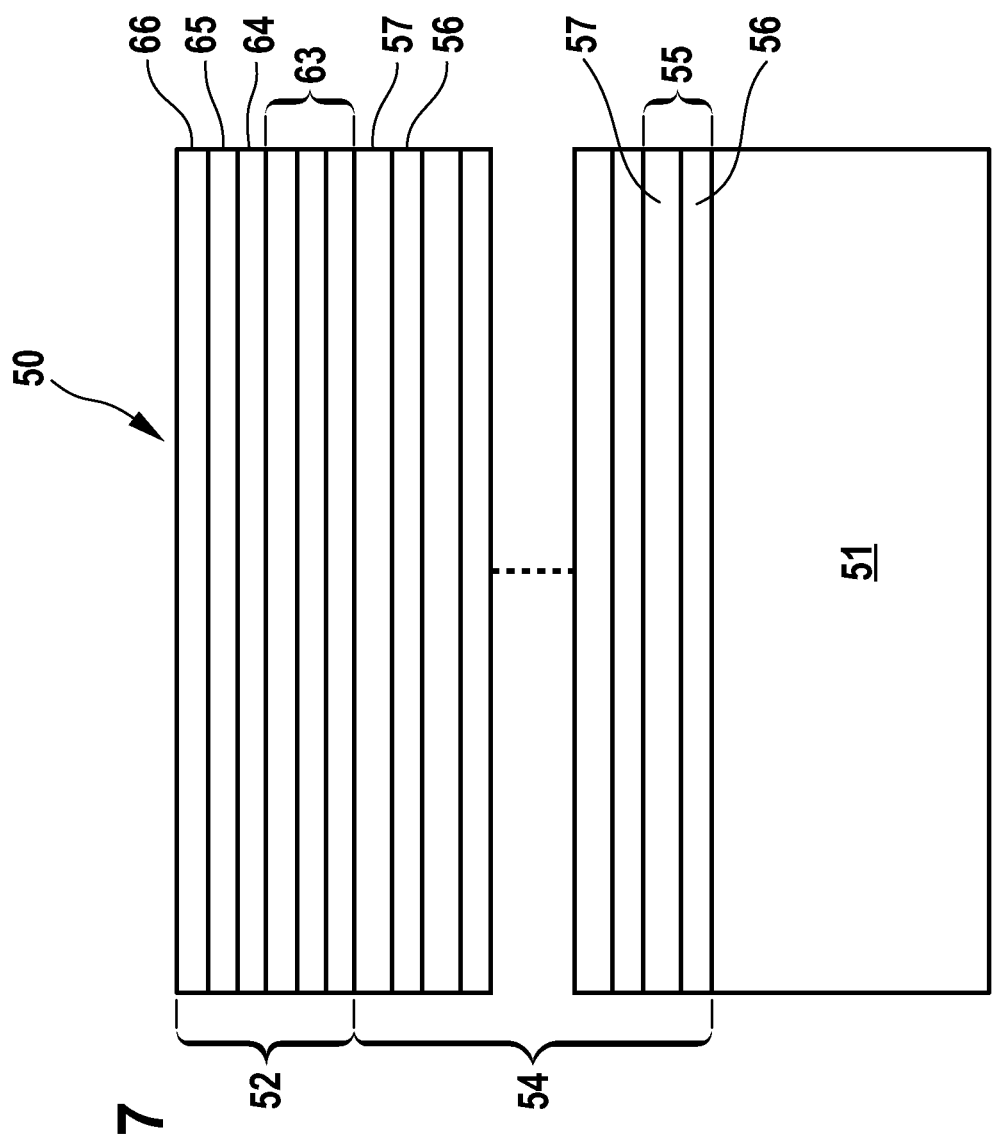
FIG. 7 a schematic of a sixth embodiment of a reflective optical element having a multilayer system.
Figure 8:
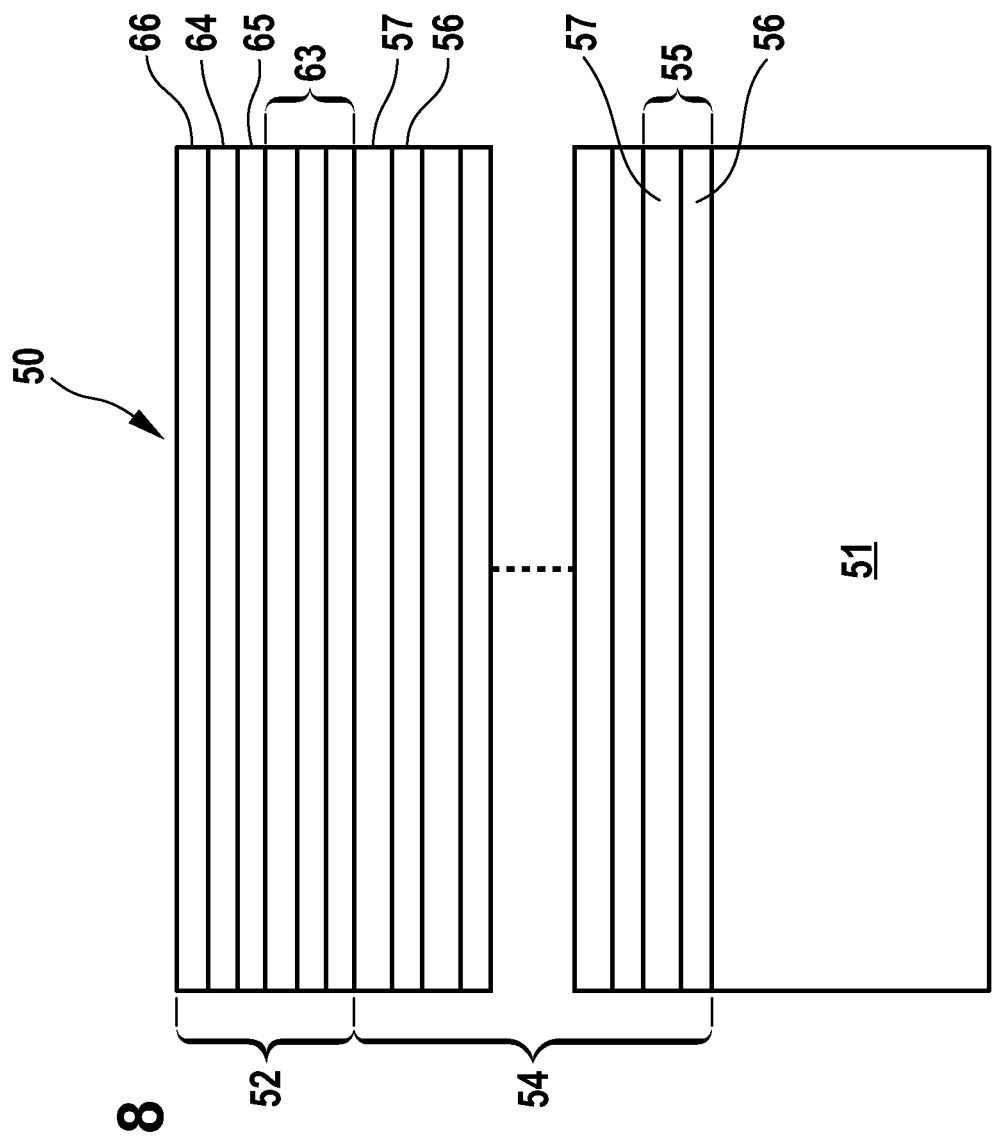
FIG. 8 a schematic of a seventh embodiment of a reflective optical element having a multilayer system.

In the examples shown in FIGS. 7 and 8, the protective layer system 52 is formed from two trilayers 63. In further variants that are not shown, the protective layer system 52 may also have been constructed from three, four, five, six, seven, eight, nine or more trilayers 63. In the variant shown in FIG. 7, the middle layer 65 in each case is of carbon and the layer 64 closer to the multilayer system 54 in each case is of boron, whereas, in the variant shown in FIG. 8, the middle layer 64 in each case is of boron and the layer 65 closer to the multilayer system 54 in each case is of carbon. More preferably, the layer 66 further removed from the multilayer system 54 consists of zirconium dioxide, boron oxide, lanthanum oxide, titanium dioxide, zirconium nitride, silicon-doped zirconium nitride, titanium nitride, silicon-doped titanium nitride, chromium nitride, silicon-doped chromium nitride, ruthenium or palladium.

Figure 9:
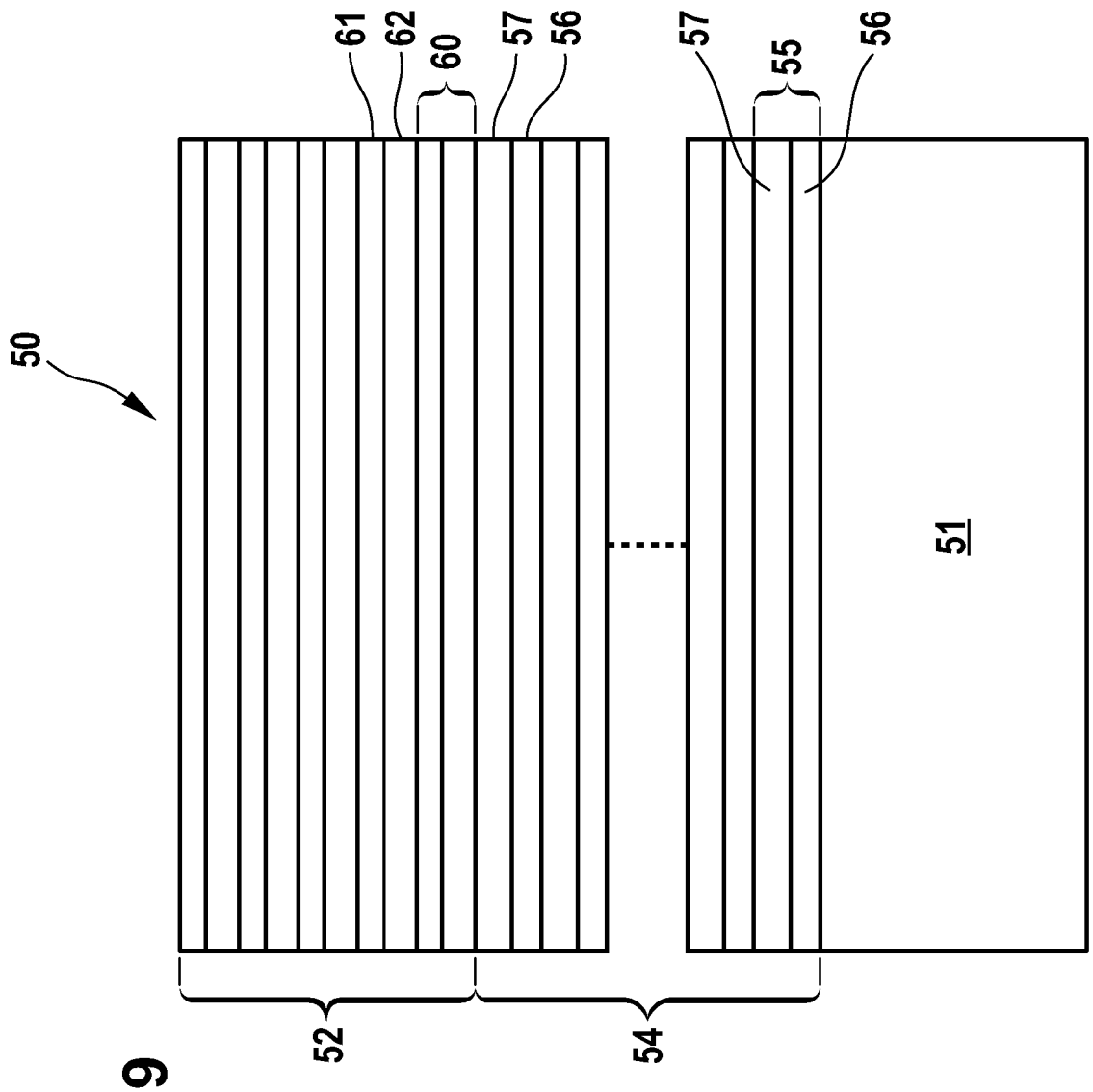
FIG. 9 a schematic of an eighth embodiment of a reflective optical element having a multilayer system.

FIG. 9, in a modification of the embodiment shown in FIG. 6, shows a reflective optical element 50 having, on a substrate 51 and a multilayer system 54, a protective layer system 52 constructed not just of two bilayers 60 but of five bilayers 60. In variants, the protective layer system may also have been extended from five trilayers. The more bi- or trilayers are provided, the more the reflectivity of the reflective optical element 50, with comparable protection function, can be optimized, for example by varying the bi- or trilayer thicknesses and/or the ratio G of the thickness of the layer of the bi- or trilayer having the smallest real part of the refractive index at the working wavelengths to the total thickness of the bi- or trilayer. Moreover, it should be pointed out that the protective layer system—analogously to the multilayer system—may have been constructed from stacks having more than just two or three layers, namely four, five, six or more layers.

Figure 10:
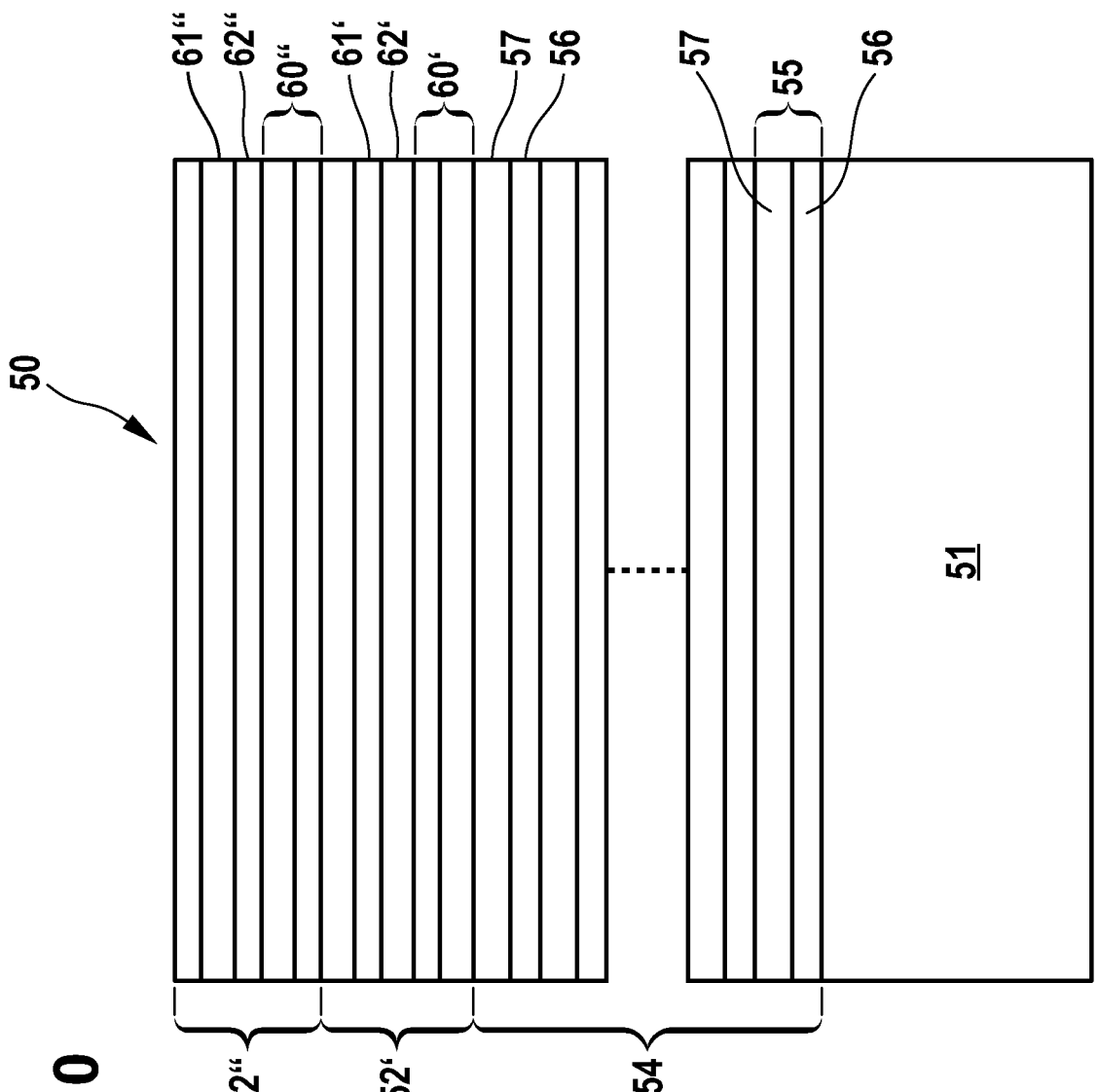
FIG. 10 a schematic of a ninth embodiment of a reflective optical element having a multilayer system.

FIG. 10 shows an embodiment in which the protective layer system is constructed analogously to a multilayer system, but has been constructed from two subsystems 52',52". In the present example, the subsystems 52', 52" are constructed from bilayers 60', 60" which preferably differ in that they differ in at least one material of the individual layers 61', 61", 62', 62". Alternatively or additionally, they may differ, for example, in the bilayer thickness and/or the ratio G of the thickness of the layer of the bilayer having the smallest real part of the refractive index at the working wavelengths to the total thickness of the bilayer. In variants, in at least one of the subsystems 52', 52", rather than bilayers 60', 60", it is also possible for trilayers or stacks having four, five, six or more individual layers to be provided. Moreover, the protective layer system may also have three, four or more subsystems. In the case of protective layer systems that can have subsystems, it is possible via the multitude of parameters available, such as material and geometric design parameters, to optimize both the protection function of the protective layer system and the reflectivity of the reflective optical element.

Various executions have been examined in more detail, of which those that follow are mentioned by way of example.

First of all, reflective optical elements based on a multilayer system with lanthanum nitride as absorber material and boron as spacer material have been examined. They have been optimized for a working wavelength of 6.6 nm in the case of quasi-normal incidence, where they have a theoretical maximum reflectivity of 80%. Above that, various protective layer systems were provided.

In the case of bilayer protective layer systems having an upper layer of 2 nm of titanium nitride and a lower layer of lanthanum nitride, it is possible to achieve a reflectivity of about 78.5% with a thickness of the lanthanum nitride layer of between about 1.9 nm and about 2.4 nm. When the lower layer is a boron layer, it is even possible to achieve a reflectivity of about 79.5% when the thickness of the boron layer is within a range from about 1.3 nm to 1.5 nm.

In the case of bilayer protective layer systems having an upper layer of 2 nm of zirconium nitride and a lower layer of lanthanum nitride, it is possible to achieve a reflectivity of just under 78% with a thickness of the lanthanum nitride layer of between about 2.2 nm and about 2.6 nm. When the lower layer is a boron layer, it is even possible to achieve a reflectivity of just under 79.5% when the thickness of the boron layer is within a range from about 1.3 nm to 1.5 nm.

In addition, trilayer protective layer systems having an uppermost layer of 2 nm of zirconium nitride and having, as middle layer, a 2 nm-thick carbon layer as diffusion barrier against oxygen have also been examined. With a lower layer of lanthanum nitride, it is possible to achieve a reflectivity of just under 79% with a thickness of the lanthanum nitride layer of between about 0.3 nm and about 0.6 nm. When the lower layer is a boron layer, it is likewise possible to achieve a reflectivity of just under 79.5% when the thickness of the boron layer is within a range from about 2.4 nm to 2.6 nm.

In addition, in a representative manner, reflective optical elements wherein the protective layer system has been constructed from two or more bi- or trilayers were examined. In the specific example, protective layer systems composed of bilayers of lanthanum oxide and boron were provided. The complex refractive index of lanthanum oxide is very similar to that of lanthanum nitride. The multilayer system here comprises lanthanum-boron multilayer systems with a lanthanum-boron period of 3.35 nm, optimized for a maximum reflectivity at 6.68 nm.

Overall, it has been established that the optimal thickness of a lanthanum oxide/boron bilayer depends on the number of these bilayers in the protective layer system. If the protective layer system has just one bilayer, this has a thickness of 3.0 nm for optimized reflectivity. If there are three bilayers, these each have a preferred thickness of 3.2 nm. For six bilayers, the bilayer thickness is preferably somewhat above 3.3 nm. Over and above twelve bilayers, a saturation effect can be observed below 3.4 nm.

Other optimization approaches that can bring an additional effect in the case of already implemented optimization with regard to bi- or trilayer thickness as a function of the number of bi- or trilayers are, for example, the ratio of the thicknesses of the individual layers of a bi- or trilayer to the total thickness of the bi- or trilayer, or the provision of an additional layer between multilayer system and protective layer system in order to achieve a phase shift.

Reflective optical elements having protective layer systems composed of three bilayers of lanthanum oxide and boron wherein the period corresponded to the period of 3.35 nm of the multilayer system of lanthanum and boron have also been considered. Both with a protective layer system composed of three bilayers that concludes with a boron layer on the vacuum side and in the case of a protective layer system composed of three bilayers that concludes with a lanthanum oxide layer on the vacuum side, a reflectivity of about 80% was achieved at a working wavelength of 6.68 nm and quasi-normal incidence.

For comparison, corresponding reflective optical elements with a monolayer protective layer system were also considered. With a protective layer system composed of a lanthanum oxide layer of the same thickness as the two protective layer systems composed of three bilayers, a reflectivity of just under 74% was achieved. If the thickness of the protective lanthanum oxide layer was reduced to a thickness of 4.02 nm, which corresponds to the thickness of three lanthanum oxide layers as in the protective layer systems composed of three bilayers, a reflectivity of somewhat above 78% was still achieved.

Moreover, the reflectivity of reflective optical elements that have a multilayer system composed of 200 stacks of lanthanum-boron pairs was examined. The multilayer system has been optimized for an working wavelength of 6.65 nm in the case of quasi-normal incidence, and the lanthanum-boron stacks have a thickness of about 3.33 nm and a ratio G' of the thickness of the alternating material of a stack having the smallest real part of the refractive index to the total thickness of the stack of 0.35.

Figure 11:
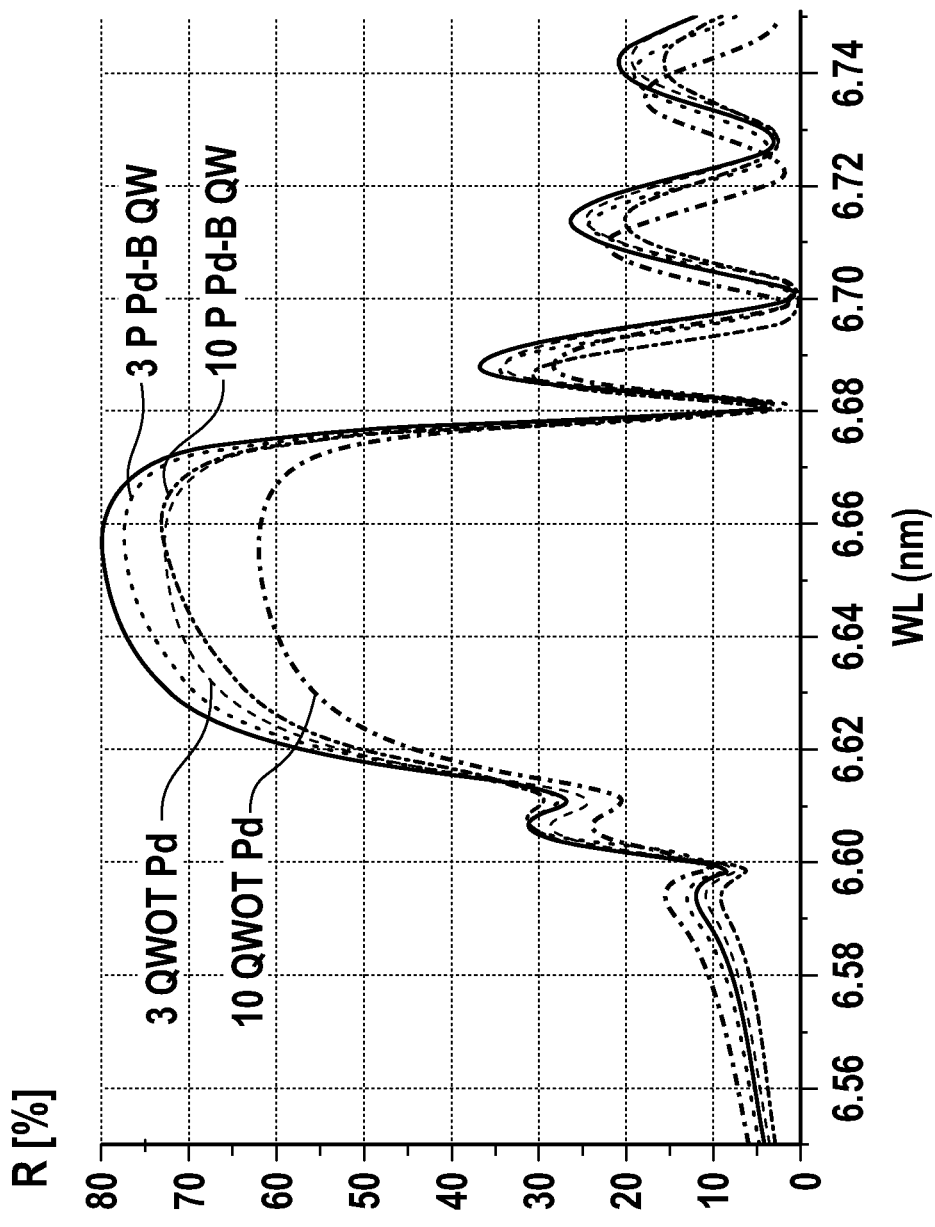
FIG. 11 reflectivity distributions as a function of wavelength for various protective layer systems on a lanthanum/boron multilayer system.

FIG. 11 is a plot of the distributions of reflectivity R in percent as a function of wavelength WL in nm in the case of quasi-normal incidence for various protective layer systems and, for comparison, without a protective layer system (solid line). Firstly, two monolayer protective layer systems of palladium were examined, one of which had a thickness of three quarters of the wavelength, i.e. about 5 nm (dashed line, 3 QWOT Pd) and the other a thickness of ten quarters of the wavelength, i.e. about 16.65 nm (thickly dash-dotted line, 10 QWOT Pd). By comparison with the reflective optical element without a protective layer system, it is possible to increase the lifetime via the protective palladium layer. But the maximum reflectivity falls from about 80% to about 72% for a palladium thickness of about 5 nm and only about 62% for a palladium thickness of about 16.65 nm. In order to increase reflectivity with a comparable lifetime, protective layer systems respectively constructed from three (dotted line, 3 P Pd—B QW) and ten (thin dash-dotted line, 10 P Pd—B QW) palladium-boron bilayers of thickness about 1.66 nm and a ratio G of the thickness of the palladium layer to the total thickness of the bilayer of 0.5 were also examined. A protective layer system composed of ten bilayers achieves a reflectivity corresponding to that of an about 5 nm-thick single palladium layer. A protective layer system constructed from three bilayers achieves a maximum reflectivity of about 77%.

Figure 12:
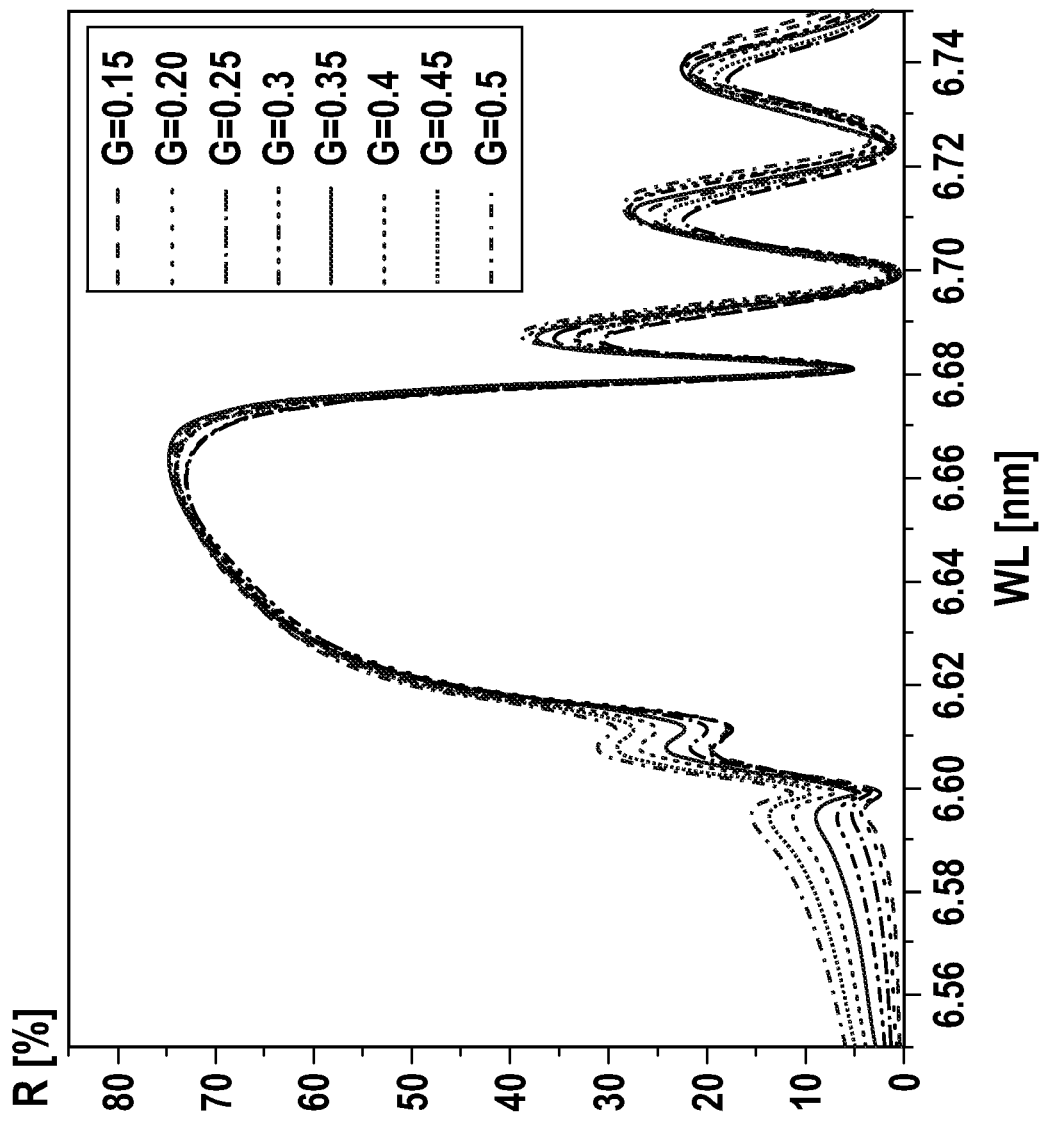
FIG. 12 reflectivity distributions as a function of wavelength for various protective layer systems with a different ratio G on a lanthanum/boron multilayer system.
Figure 13:
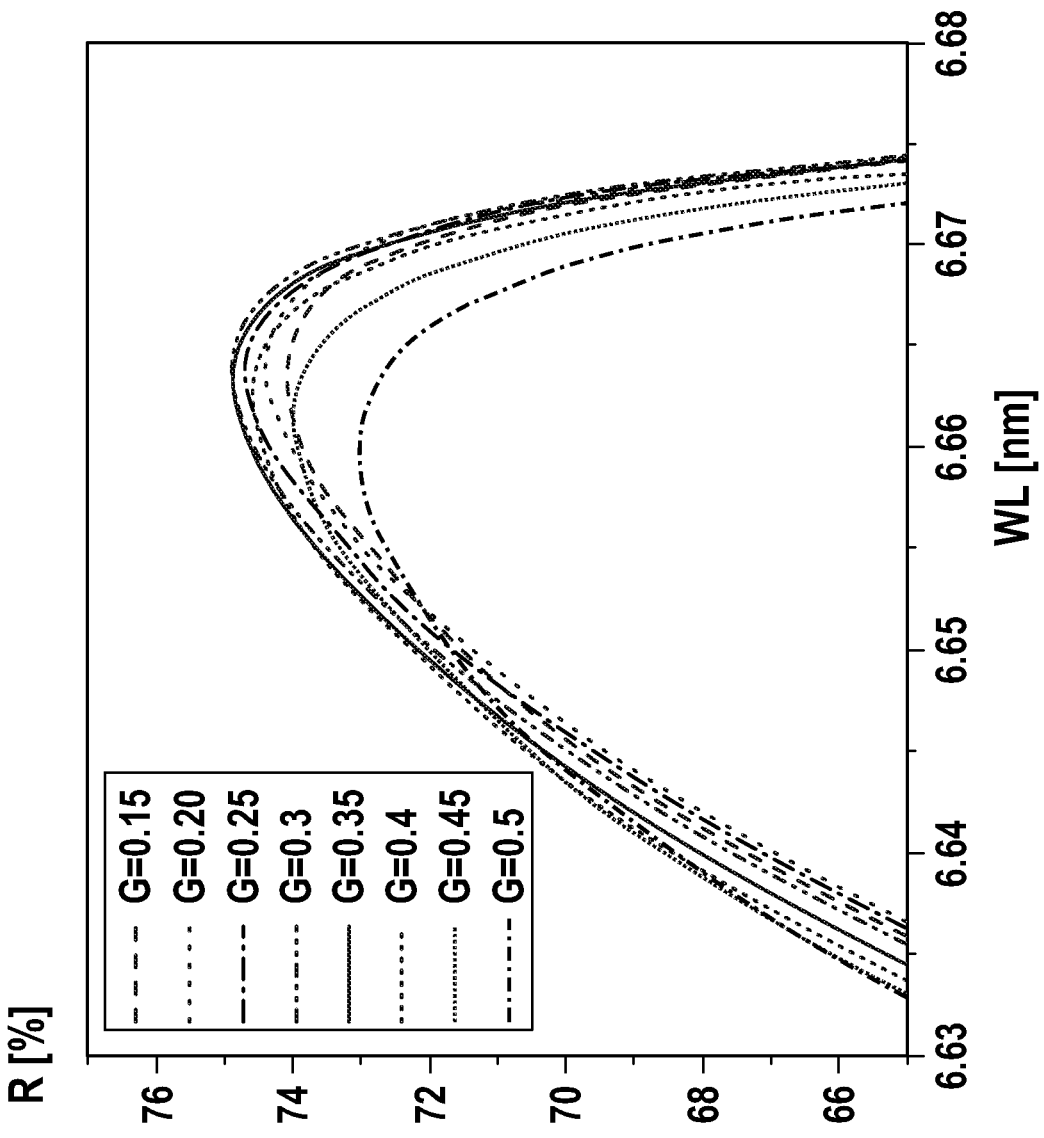
FIG. 13 an enlarged cross section of the reflectivity distributions from FIG. 12.

For the protective layer system made of ten bilayers, an attempt was subsequently made to optimize the reflectivity by varying the ratio G. The distributions of reflectivity R in percent as a function of wavelength WL in nm in the case of quasi-normal incidence for corresponding protective layer systems with different ratio G are plotted in FIG. 12 and FIG. 13, with FIG. 13 showing a detail from FIG. 12 for the wavelengths WL from 6.63 nm to 6.68 nm. Protective layer systems having ratios G of 0.15 (dashed line), 0.20 (sparsely dotted line), 0.25 (sparsely dash-dotted line), 0.3 (dashed and double-dotted line), 0.35 (solid line), 0.4 (closely dotted line), 0.45 (thinly and very closely dotted line) and 0.5 (closely dash-dotted line) were examined. The maximum reflectivity was achieved with a ratio G of 0.3.

In addition, for reflective optical elements with these lanthanum-boron multilayer systems, comparable protective layer systems composed of lanthanum oxide or lanthanum oxide bilayers were also examined.

Figure 14:
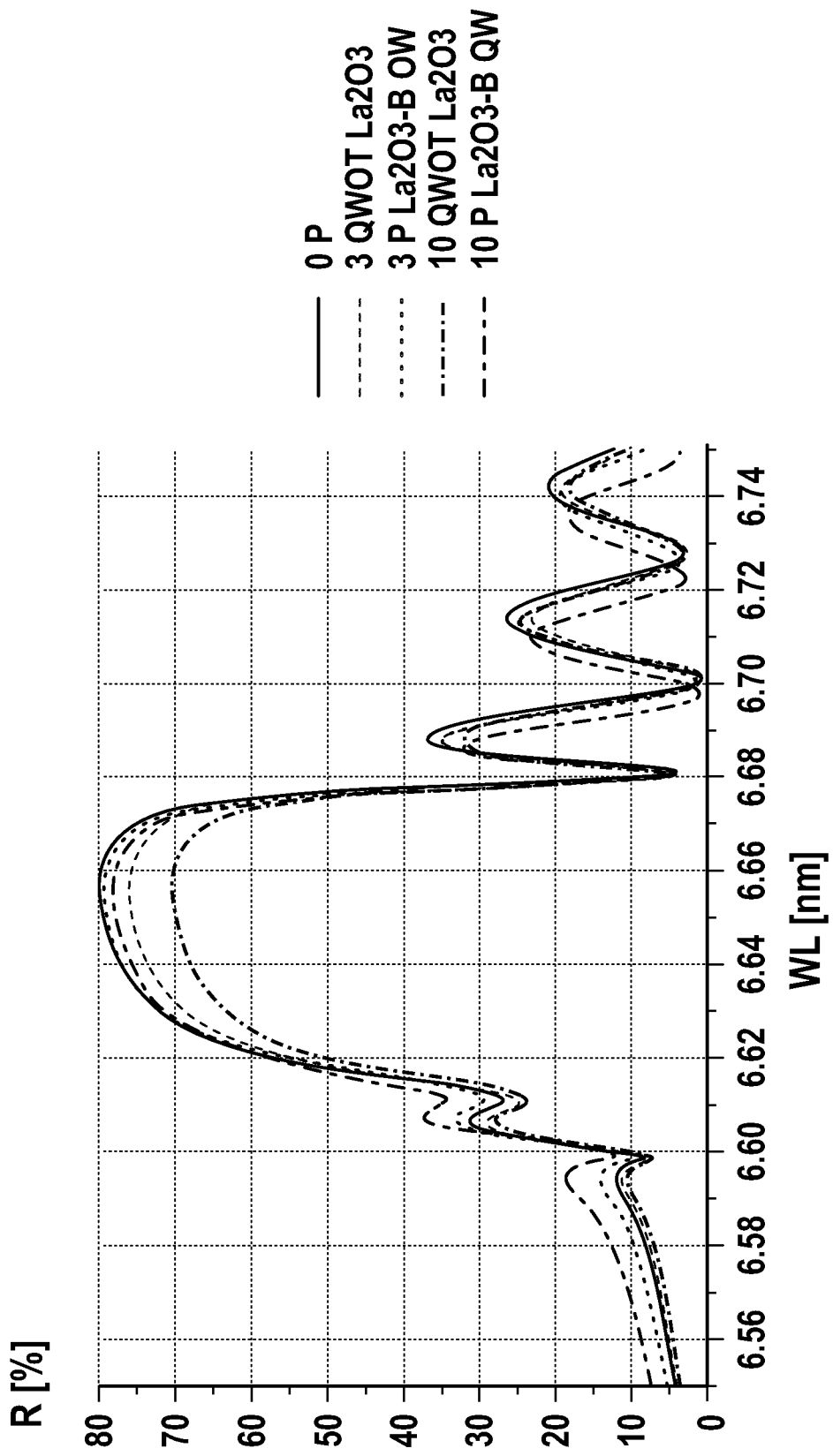
FIG. 14 reflectivity distributions as a function of wavelength for various protective layer systems on a lanthanum oxide/boron multilayer system.

FIG. 14 is a plot of the distributions of reflectivity R in percent as a function of wavelength WL in nm in the case of quasi-normal incidence for various protective layer systems and, for comparison, without a protective layer system (solid line, 0 P). Firstly, two monolayer protective layer systems of lanthanum oxide were examined, one of which had a thickness of three quarters of the wavelength, i.e. about 5 nm (dashed line, 3 QWOT La2O3) and the other a thickness of ten quarters of the wavelength, i.e. about 16.65 nm (closely dash-dotted line, 10 QWOT La2O3). By comparison with the reflective optical element without a protective layer system, it is possible to increase the lifetime via the protective lanthanum oxide layer. But the maximum reflectivity falls from about 80% to about 75% for a lanthanum oxide thickness of about 5 nm and just under 70% for a lanthanum oxide thickness of about 16.65 nm. In order to increase reflectivity with a comparable lifetime, protective layer systems respectively constructed from three (dotted line, 3 P La2O3-B QW) and ten (sparsely dash-dotted line, 10 P La2O3-B QW) lanthanum oxide-boron bilayers of thickness about 1.66 nm and a ratio G of the thickness of the lanthanum oxide layer to the total thickness of the bilayer of 0.5 were also examined. Both with a protective layer system composed of three bilayers and with one composed of ten bilayers, maximum reflectivities above that for a 5 nm-thick lanthanum oxide layer were achieved, namely at about 78% for ten bilayers and about 79% for three bilayers.

Figure 15:
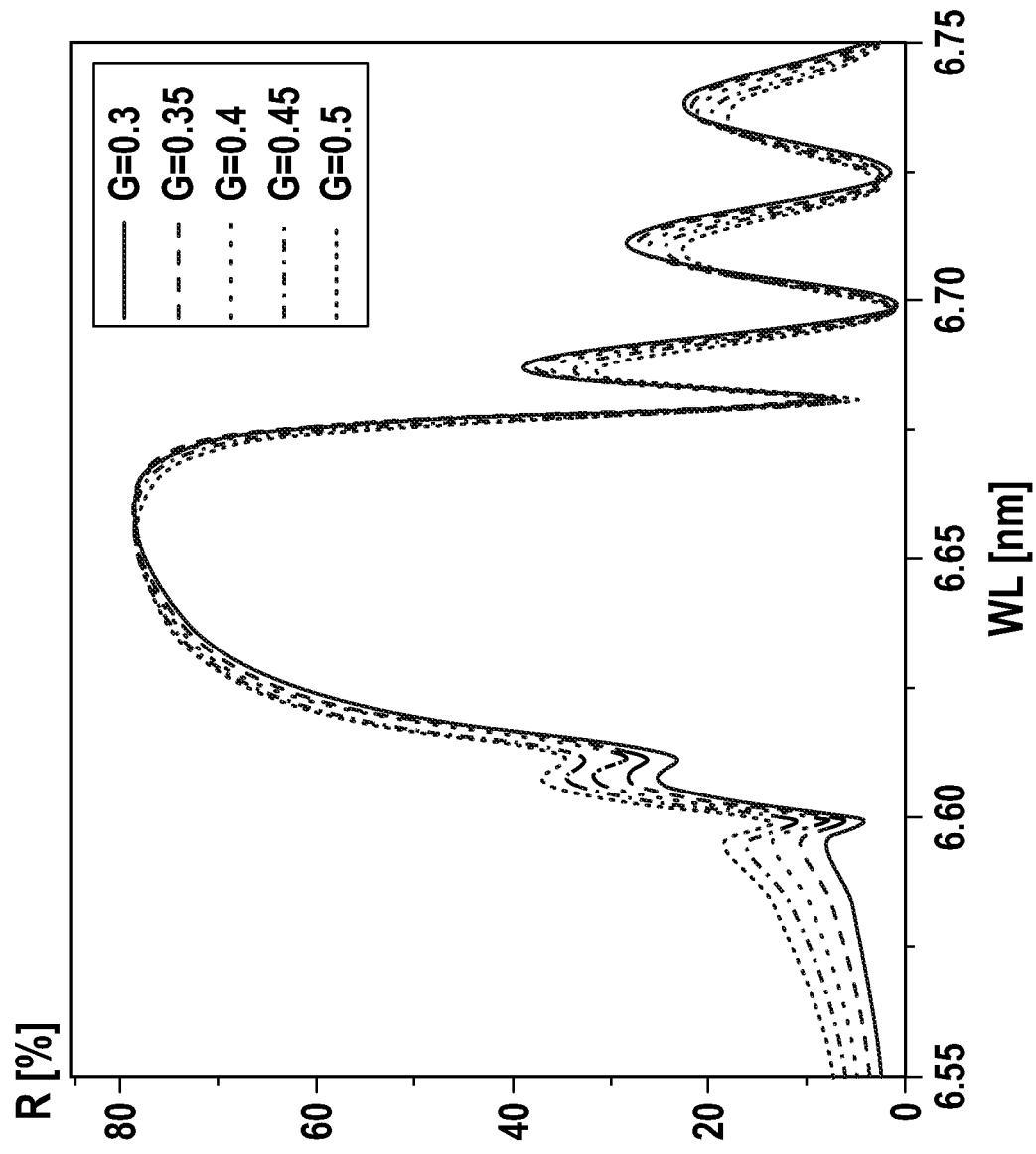
FIG. 15 reflectivity distributions as a function of wavelength for various protective layer systems with a different ratio G on a lanthanum oxide/boron multilayer system.
Figure 16:
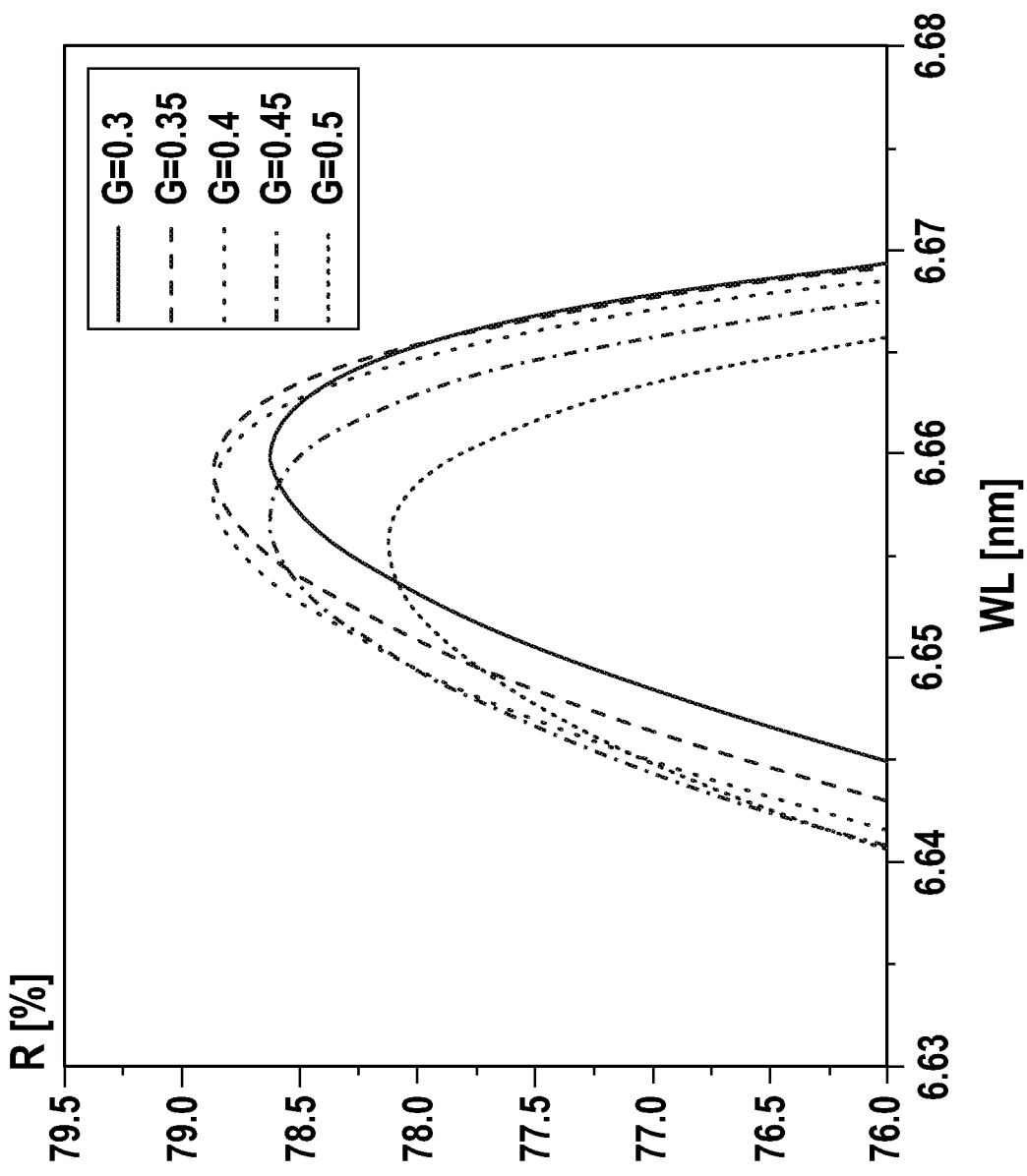
FIG. 16 an enlarged cross section of the reflectivity distributions from FIG. 15.

For the protective layer system made of 10 bilayers, an attempt was subsequently made to optimize the reflectivity by varying the ratio G. The distributions of reflectivity R in percent as a function of wavelength WL in nm in the case of quasi-normal incidence for corresponding protective layer systems with different ratio G are plotted in FIG. 15 and FIG. 16, with FIG. 16 showing a detail from FIG. 15 for the wavelengths WL from 6.63 nm to 6.68 nm. Protective layer systems having ratios G of 0.3 (solid line), 0.35 (dashed line), 0.4 (sparsely dotted line), 0.45 (dash-dotted line) and 0.5 (closely dotted line) were examined. The maximum reflectivity was achieved with a ratio G of 0.4.

With the aid of the protective layer systems of complex construction, the optimizing of the layer thicknesses for chosen layer materials can be conducted particularly effectively with regard to the positioning of the electromagnetic wave that forms on reflection at the reflective optical element. For this purpose, the more strongly absorbing layers should each be in the region of relatively low field intensity. For protective layer systems in a monolayer configuration, for example, it is possible to work only with layer thicknesses up to half the period of the multilayer system for this very effective manner of reflectivity optimization.

A particular advantage of the multilayer protective layer systems is also particularly good protection against oxidative contamination. If it is assumed that the diffusion time of an oxygen atom at constant temperature is proportional to the square of the diffusion length of the oxygen atom, the provision of five bilayers or trilayers in the protective layer system can extend the diffusion time as far as the multilayer system by up to fifty times compared to just one bi- or trilayer.

It should be pointed out that, for the other material combinations that are possible within the scope of these configurations, comparable results are found both for the multilayer system and for the protective layer system. More particularly, the loss of reflectivity owing to the protective layer system can be kept predominantly below 2% by suitable choice of materials and optimization of the layer thicknesses. While examples have been considered for a working wavelength of 6.6 nm, the findings are applicable to all wavelengths in the range between 1 nm and 12 nm, especially also in the range from 2.3 nm to 4.4 nm, in which water is transparent to soft x-radiation and in which x-ray spectroscopy can preferentially be conducted on biological samples.

What is claimed is:

1. An optical element, comprising:
   a substrate;
   a multilayer system supported by the substrate, the multilayer system comprising:
   a plurality of first layers, each of the first layers comprising a first material selected from the group consisting of thorium, uranium, barium, nitrides thereof, carbides thereof, borides thereof, lanthanum, lanthanum carbide, lanthanum nitride, lanthanum boride; and
   a plurality of second layers, each of the second layers comprising a second material selected from the group consisting of carbon, boron, boron carbide;
   a protective system comprising a nitride, an oxide and/or a platinum metal,
   wherein:
   the multilayer system is between the substrate and the protective system;

the first layers and second layers are stacked in an alternating fashion;

the first material has a refractive index with a real part at a wavelength;

the second material has a refractive index with a real part at the wavelength;

the real part of the refractive index of the first material at the wavelength is different from the real part of the refractive index of the second material at the wavelength;

the wavelength is from 1 nm to 12 nm;

the protective system comprises at least three trilayers; and the optical element is reflective for radiation at the wavelength.

2. The optical element according to claim 1, wherein the optical element is reflective for radiation at a wavelength of 5 nm to 8 nm.

3. The optical element according to claim 1, wherein the protective layer system comprises a material that is different from both the first material and the second material.

4. The optical element according to claim 1, wherein one of the at least three bilayers or the at least three trilayers of the protective system comprises a layer comprising a material selected from the group consisting of the first material and the second material.

5. The optical element according to claim 1, wherein, for at least one of the trilayers:

a middle layer comprises a material selected from the group consisting of carbon, boron and boron carbide; and a layer that is closest to the multilayer system comprises a material selected from the group consisting of the first material and the second material.

6. The optical element according to claim 1, wherein, for each of the trilayers:

a middle layer of the trilayer comprises carbon, and a layer of the trilayer that is closest to the multilayer system comprises boron; or the middle layer of the trilayer comprises boron, and the layer of the trilayer that is closest to the multilayer system comprises carbon.

7. The optical element according to claim 1, wherein:

a repeating sequence of the alternating first and second layers in the multilayer system defines a stack;

the real part of the refractive index of the first material at the wavelength is less than the real part of the refractive index of the second material at the wavelength;

a ratio G' of the first layer to a total thickness of the stack is constant;

the protective layer is in the form of a multilayer, wherein the at least three trilayers define a stack of the multilayer of the protective layer, comprising a low refractive index layer;

the low refractive index layer is the layer of the multilayer of the protective layer which has a lowest real part of a refractive index at the wavelength; and a ratio G of a thickness of the low refractive index layer to a total thickness of the stack of the multilayer of the protective layer does not equal the ratio G'.

8. The optical element according to claim 1, wherein the protective layer system comprises two subsystems that differ in at least one material.

9. The optical element according to claim 1, wherein the protective layer system comprises a material from the group formed from zirconium oxide, boron oxide, lanthanum oxide, titanium dioxide, zirconium nitride, silicon-doped zirconium nitride, titanium nitride, silicon-doped titanium nitride, chromium nitride, silicon-doped chromium nitride, ruthenium and palladium.

10. The optical element of claim 1, wherein the optical element is a mirror.

11. A system, comprising:

an optical element according to claim 1, wherein the system is an optical system.

12. An apparatus, comprising:

a system which comprises an optical element according to claim 1, wherein the apparatus is an EUV lithography apparatus.

13. The apparatus of claim 12, wherein the optical element is a mirror.

14. The optical element of claim 1, wherein:

each trilayer comprises a first trilayer layer comprising a first trilayer material, a second trilayer layer comprising a second trilayer material and a third trilayer layer comprising a material; and for each of the three trilayers, at least one material selected from the group consisting of the first trilayer material, the second trilayer material and the third trilayer material is different from both the first material and the second material.

15. The optical element of claim 14, wherein each of the three trilayers comprises the same first, second and third trilayer layers.

* * * * *

UNITED STATES PATENT AND TRADEMARK OFFICE
CERTIFICATE OF CORRECTION

PATENT NO. : 10,916,356 B2  
APPLICATION NO. : 16/511166  
DATED : February 9, 2021  
INVENTOR(S) : Dmitry Kuznetsov et al.

Page 1 of 1

It is certified that error appears in the above-identified patent and that said Letters Patent is hereby corrected as shown below:

In the Claims

Column 14, Line 1, Claim 7, delete "G' of" and insert -- G' of a thickness of --.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*